United States Patent
Oh et al.

(10) Patent No.: US 12,173,216 B2
(45) Date of Patent: Dec. 24, 2024

(54) ETCHANT COMPOSITION FOR SEMICONDUCTOR SUBSTRATES

(71) Applicant: ENF TECHNOLOGY CO., LTD., Gyeonggi-do (KR)

(72) Inventors: Jeong Sik Oh, Gyeonggi-do (KR); Hak Soo Kim, Gyeonggi-do (KR); Myung Ho Lee, Gyeonggi-do (KR)

(73) Assignee: ENF TECHNOLOGY CO., LTD., Gyeonggi-Do (KR)

( * ) Notice: Subject to any disclaimer, the term of this patent is extended or adjusted under 35 U.S.C. 154(b) by 0 days.

(21) Appl. No.: 17/660,342

(22) Filed: Apr. 22, 2022

(65) Prior Publication Data

US 2022/0348825 A1 Nov. 3, 2022

(30) Foreign Application Priority Data

Apr. 22, 2021 (KR) .......................... 10-2021-0052445

(51) Int. Cl.
   *C09K 13/08* (2006.01)
   *H01L 21/306* (2006.01)
(52) U.S. Cl.
   CPC ........ *C09K 13/08* (2013.01); *H01L 21/30604* (2013.01)

(58) Field of Classification Search
   None
   See application file for complete search history.

(56) References Cited

U.S. PATENT DOCUMENTS

| | | | | |
|---|---|---|---|---|
| 3,251,777 A | * | 5/1966 | Easley | C23F 1/42 252/79.4 |
| 2010/0112728 A1 | * | 5/2010 | Korzenski | H01L 21/02079 257/E21.294 |
| 2013/0228220 A1 | * | 9/2013 | Schum | H01L 21/30604 438/57 |
| 2015/0069011 A1 | * | 3/2015 | Guo | H01B 1/22 216/13 |
| 2021/0198572 A1 | * | 7/2021 | Wada | H01L 21/30604 |

* cited by examiner

*Primary Examiner* — Shamim Ahmed
(74) *Attorney, Agent, or Firm* — McCoy Russell LLP

(57) ABSTRACT

Provided is an etchant composition for a semiconductor substrate which may selectively etch a high-concentration doped layer of an extrinsic semiconductor, and according to the present disclosure, an etchant composition for a semiconductor substrate which, in etching an extrinsic semiconductor substrate including doped layers having different doping concentrations, may etch the high-concentration doped layer at a high selection ratio, and suppress bubble formation during an etching process to allow uniform and stable etching, an etching method using the same, and a manufacturing method of a semiconductor substrate may be provided.

11 Claims, No Drawings

ETCHANT COMPOSITION FOR SEMICONDUCTOR SUBSTRATES

CROSS-REFERENCE TO RELATED APPLICATION

The present application claims priority to Korean Patent Application No. 10-2021-0052445, filed on Apr. 22, 2021. The entire contents of the above-listed application are hereby incorporated by reference for all purposes.

TECHNICAL FIELD

The following disclosure relates to an etchant composition for a semiconductor substrate, and more particularly, to an etchant composition for a semiconductor substrate which may stably etch an extrinsic semiconductor substrate.

BACKGROUND

Recently, a wafer thinning process which is applied to manufacture of a semiconductor device is used for various purposes. For example, it may be used for manufacture of an extrinsic semiconductor substrate for manufacture of an ultra-thin wafer, and may be a process of selectively removing a high-concentration doped layer to leave a low-concentration doped layer.

Specifically, the extrinsic semiconductor substrate described above may have a structure in which a first layer having a high-concentration doped layer and a second layer having a doped layer having a lower concentration than the first layer are laminated sequentially. In addition, depending on its use, a coating layer selected from a metal layer, an insulation layer, and the like may be further formed on the second layer. Here, the selective etching process of the extrinsic semiconductor substrate may correspond to a process of removing the first layer to leave the second layer.

The selective etching process may be performed by an etching method using plasma. However, the etching method as such may cause damage from etching on the surface of a substrate, and contamination from metal such as nickel or iron while etching. In addition, when a lower portion of a wafer having a pattern formed thereon is thinned, leakage current characteristics may be deteriorated by chip loss of a substrate edge portion, which is thus not preferred.

In addition, the selective etching process may be performed by a wet etching method. Here, a wet etchant composition may include a mixed solution of an oxidizing agent, a reducing agent, a buffering agent, and the like, and for example, may be a mixed solution of a hydrofluoric acid (HF), a nitric acid ($HNO_3$), and an acetic acid ($CH_3COOH$). However, since the etching method shows a significantly low etching rate on a silicon substrate which has a resistivity of about 0.068 Ω·cm, spots are formed on the surface of a substrate during the etching process. Thus, it is not preferred since there is an inconvenience to further perform a secondary cleaning process for removing the spots.

Therefore, a study for an etchant composition for solving the problems is still needed.

SUMMARY

An embodiment of the present disclosure is directed to providing an etchant composition for stably etching an extrinsic semiconductor substrate and a use thereof.

Specifically, an embodiment of the present disclosure is directed to providing an etchant composition which may selectively etch a high-concentration doped layer in an extrinsic semiconductor substrate including doped layers having non-metals doped at different concentrations from each other, an etching method using the same, and a manufacturing method of a semiconductor device.

Specifically, an embodiment of the present disclosure is directed to providing an etchant composition which may uniformly and stably etch an object to be etched in spate of a small concentration difference between doped layers having non-metals doped at different concentrations, an etching method using the same, and a manufacturing method of a semiconductor device.

Specifically, an embodiment of the present disclosure is directed to providing an etching method which may provide a uniform etch selection ratio for an extrinsic semiconductor substrate by effectively suppressing bubble formation during an etching process, and a manufacturing method of a semiconductor device.

In one general aspect, an etchant composition for a semiconductor substrate includes: a compound represented by the following Chemical Formula 1, a hydrofluoric acid, a nitric acid, an acetic acid, a phosphoric acid, and a balance of water:

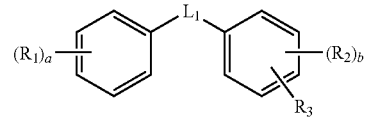

Chemical Formula 1 wherein
$R_1$ and $R_2$ are independently of each other a carboxylate, a sulfonate, or a sulfate;
$R_3$ is C1-C10 alkyl;
$L_1$ is a divalent linking group;
a is an integer of 1 to 3;
b is an integer of 0 to 3; and
when a or b is an integer of 2 or more, each substituent may be identical to or different from each other.

In the etchant composition for a semiconductor substrate according to an exemplary embodiment of the present disclosure, in the compound represented by Chemical Formula 1, Li may be —O—, —S—, or —NH—; and a and b may be independently of each other an integer of 1 or 2.

In the etchant composition for a semiconductor substrate according to an exemplary embodiment of the present disclosure, in the compound represented by Chemical Formula 1, both $R_1$ and $R_2$ may be a sulfonate; and $R_3$ may be C6-C10 alkyl.

The etchant composition for a semiconductor substrate according to an exemplary embodiment of the present disclosure may include 0.001 to 1 wt % of the compound represented by Chemical Formula 1, 4 to 20 wt % of the hydrofluoric acid, 4 to 20 wt % of the nitric acid, 20 to 60 wt % of the acetic acid, 1 to 20 wt % of the phosphoric acid, and a balance of water, with respect to the total weight of the etchant composition for a semiconductor substrate.

The etchant composition for a semiconductor substrate according to an exemplary embodiment of the present disclosure may include two or more of the compounds represented by Chemical Formula 1 which are different from each other.

The etchant composition for a semiconductor substrate according to an exemplary embodiment of the present disclosure may further include diphenyl oxide disulfonate.

In the etchant composition for a semiconductor substrate according to an exemplary embodiment of the present disclosure, the semiconductor substrate may be an extrinsic semiconductor substrate including a first doped layer having a non-metal doped at a first concentration and a second doped layer having a non-metal doped at a second concentration lower than the first concentration.

The etchant composition for a semiconductor substrate according to an exemplary embodiment of the present disclosure may satisfy the following Relation 1:

$$E_{Sub}/E_{Epi} \geq 30 \quad \text{Relation 1}$$

wherein $E_{Sub}$ is an etching rate for the first doped layer; and
$E_{Epi}$ is an etching rate for the second doped layer.

The etchant composition for a semiconductor substrate according to an exemplary embodiment of the present disclosure may satisfy Relation 1 and also satisfy the etching rate for the first doped layer of 5 to 30 μm/min and the etching rate for the second doped layer of 0 to 0.5 μm/min.

The etchant composition for a semiconductor substrate according to an exemplary embodiment of the present disclosure may satisfy Relation 1 and also satisfy a contact angle ($\gamma_{sub}$) to the first doped layer of 44° or less. In addition, a difference between the contact angles to the first doped layer and the second doped layer ($\gamma_{epi}$-$\gamma_{sub}$) may be 3° or more.

In another general aspect, an etching method includes: bringing an extrinsic semiconductor substrate including a first doped layer having a non-metal doped at a first concentration and a second doped layer having a non-metal doped at a second concentration lower than the first concentration into contact with the etchant composition for a semiconductor substrate described above.

In still another general aspect, a manufacturing method of a semiconductor device includes: the etching method described above.

The etchant composition according to the present disclosure may etch a high-concentration doped layer at a high selection ratio, in etching an extrinsic semiconductor substrate including doped layers having different doping concentrations from each other. In addition, the etching is uniformly and stably performed, and bubble formation is minimized in the etching. Thus, it is commercially advantageous in providing a highly reliable extrinsic semiconductor substrate.

In particular, the etchant composition according to the present disclosure may uniformly etch an object to be etched in spite of a small concentration difference between doped layers having non-metals doped at different concentrations from each other. Thus, recently, it is advantageous for an etching process for providing an extrinsic semiconductor substrate according to the requirement for a semiconductor device for miniaturization and higher resolution.

In addition, it has an advantage of maintaining etching properties stably for a long time with the improved processing number of sheets. Also, the etchant composition according to the present disclosure has excellent storage stability and is stable without lowering the etching processing number of sheets though it is used for a long time or is in storage.

DETAILED DESCRIPTION

Features of the present disclosure and methods of achieving them will become apparent from the following detailed description of exemplary embodiments. However, the present disclosure is not limited to exemplary embodiments disclosed below, but will be implemented in various forms. The exemplary embodiments of the present disclosure make disclosure of the present disclosure thorough and are provided so that those skilled in the art can easily understand the scope of the present disclosure. Therefore, the present disclosure will be defined by the scope of the appended claims. Hereinafter, the etchant composition according to the present disclosure will be described in detail.

The term "extrinsic semiconductor substrate" in the present specification refers to a semiconductor substrate on (into) which a non-metal is doped (injected). Here, the non-metal may be one or two or more selected from a non-metal element group, and a non-metal element may be an element other than a metal element. In addition, a p-type semiconductor substrate or an n-type semiconductor substrate may be obtained depending on a doped non-metal element.

In addition, the term "first doped layer" in the present specification refers to a layer having a relatively high concentration of doped non-metals. In addition, it may have the same meaning as a high-concentration doped layer in the specification, and is an object to be etched of the etchant composition according to the present disclosure.

In addition, the term "second doped layer" in the present specification refers to a layer having a relatively low concentration of doped non-metals. In addition, it may have the same meaning as the low-concentration doped layer in the specification.

In addition, the term "alkyl" in the present specification may include both linear and branched chains.

In addition, the term "carboxylate" in the present specification refers to a substituent including a monovalent anion derived from a carboxylic acid, and in the present specification, may include an embodiment of *—COOH or a salt thereof.

In addition, the term "sulfonate" in the present specification refers to a substituent including a monovalent anion derived from a sulfonic acid, and in the present specification, may include an embodiment of *—S(=O)$_2$—OH or a salt thereof.

In addition, the term "sulfate" in the present specification refers to a substituent including a monovalent anion derived from a sulfuric acid, and in the present specification, may include an embodiment of *—O—SS(=O)$_2$—OH or a salt thereof.

In addition, the term "etch selection ratio" in the present specification refers to a ratio of an etching rate to an extrinsic semiconductor substrate ($E_{sub}/E_{Epi}$).

Recently, according to the requirement for a semiconductor device, a doping level of a high-concentration doped layer on an extrinsic semiconductor substrate is gradually lowered. Thus, it becomes impossible to implement an etching rate to be desired by a previously developed etchant composition. Here, a doping level of a high-concentration doped layer being lowered means a difference in doping level from a low-concentration doped layer, that is, a doping concentration difference becoming smaller.

The present inventors intensified a study under the background as such. As a result, the present inventors found that after a first doped layer is etched with a combination with a certain multivalent anionic additive, a plurality of the additives are adsorbed on an exposed second doped layer to significantly decrease an etching rate. In particular, the etchant composition according to the present disclosure has meaning in that a high etching rate for a desired object to be etched may be implemented not only on an extrinsic semiconductor substrate (for example, a difference in doping concentration: $7.0 \times 10^{18}/cm^3$ or more) but also on an extrinsic semiconductor substrate having a significantly lowered doping concentration difference. In addition, more advantages may be provided for etching properties with reduced bubble formation during an etching process, and thus, the composition has advantages also in terms of a process. As such, the etchant composition according to the present disclosure may uniformly etch a doped layer at a higher concentration at a high selection ratio in an extrinsic semiconductor substrate including doped layers having different doping concentrations from each other, without involving a complicated process. Furthermore, recently, the etchant composition according to the present disclosure has meaning in terms of exerting an advantageous effect even on an extrinsic semiconductor substrate having a low doping concentration difference which is required for a semiconductor device.

Hereinafter, the etchant composition according to the present disclosure will be described.

Specifically, the etchant composition according to an exemplary embodiment of the present disclosure may include a compound represented by the following Chemical Formula 1, a hydrofluoric acid, a nitric acid, an acetic acid, a phosphoric acid, and a balance of water:

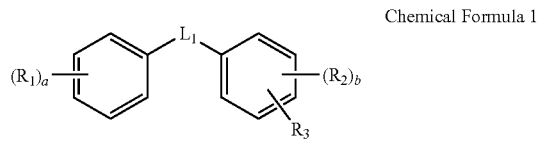

Chemical Formula 1 wherein $R_1$ and $R_2$ are independently of each other a carboxylate, a sulfonate, or a sulfate;

$R_3$ is C1-C10 alkyl;

$L_1$ is a divalent linking group;

a is an integer of 1 to 3;

b is an integer of 0 to 3; and when a or b is an integer of 2 or more, each substituent may be identical to or different from each other.

The etchant composition according to an exemplary embodiment of the present disclosure is an etchant composition for a semiconductor substrate, and the semiconductor substrate may be an extrinsic silicon semiconductor substrate. Specifically, the etchant composition according to the present disclosure may be an extrinsic semiconductor substrate including doped layers having non-metals doped at different concentrations from each other, and an object to be etched to be desired in the present disclosure may be a doped layer at a relatively high concentration on the extrinsic semiconductor substrate.

A specific example of the object to be etched of the etchant composition according to an exemplary embodiment of the present disclosure may be [a silicon substrate having a non-metal doped at 1.0 to $9.9 \times 10^{18}/cm^3$]. In addition, a silicon substrate having a non-metal doped at a lower concentration may have a difference of $7.0 \times 10^{18}/cm^3$ or more, or a difference of less than $7.0 \times 10^{18}/cm^3$. In particular, it may have a difference of less than 1.0 to $7.0 \times 10^{18}/cm^3$ which is a significantly decreased doping level difference, according to the recent requirement for a semiconductor device.

In the etchant composition according to an exemplary embodiment of the present disclosure, the extrinsic silicon semiconductor substrate may have one or more non-metals doped selected from boron, arsenic, phosphorus, and the like. Here, when an element having 4 or fewer outermost electrons such as boron is doped, the extrinsic semiconductor substrate may be a p-type extrinsic semiconductor substrate; and when an element having more than 4 outermost electrons such as arsenic and phosphorus is doped, the extrinsic semiconductor substrate may be an n-type extrinsic semiconductor substrate.

The etchant composition according to an exemplary embodiment of the present disclosure increases affinity with Si in a chemical liquid and imparts an advantage to a driving force to move the compound represented by Chemical Formula 1 used as an additive to the surface of a semiconductor substrate. Furthermore, the chemical liquid is uniformly adsorbed on the surface of a substrate to effectively form a passivation layer, thereby showing improved etching properties.

In addition, the etchant composition according to the present disclosure is used to adsorb the compound of Chemical Formula 1 on the surface of a semiconductor substrate when etching an extrinsic semiconductor substrate, thereby controlling a Si etching rate. Thus, when the etchant composition according to the present disclosure is used, the etching rate of a low-concentration doped layer is significantly decreased and the etching rate of a high-concentration doped layer is increased, thereby providing an improved etch selection ratio.

In the etchant composition according to an exemplary embodiment of the present disclosure, in Chemical Formula 1, $L_1$ may be —O—, —S—, or —NH—; and a and b may be independently of each other an integer of 1 or 2.

In the etchant composition according to an exemplary embodiment of the present disclosure, in Chemical Formula 1, both $R_1$ and $R_2$ may be a sulfonate; and $R_3$ may be C6-C10 alkyl. Here, the sulfonate may be *—S(=O)$_2$—OH or a salt thereof, and the salt may be a salt of an alkali metal exemplified by Na, K, or the like.

In Chemical Formula 1 according to an exemplary embodiment of the present disclosure, $L_1$ may be —O— or —S—; both $R_1$ and $R_2$ may be sulfonate; and $R_3$ may be C6-C10 alkyl; and a and b may be independently of each other an integer of 1 or 2.

In terms of selectively etching a high-concentration doped layer at a more improved selection ratio, specifically, the compound of Chemical Formula 1 may be C6-C10 linear alkyl diphenyl oxide disulfonate, and for example, a compound represented by Chemical Formula 2. Here, as the number of carbons in the compound of Chemical Formula 1 is smaller, a force moving to the surface of an object to be etched is decreased to impart an advantage to an etching rate, which is more beneficial to suppress bubble formation in terms of process.

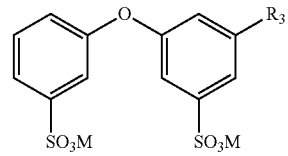

Chemical Formula 2 wherein $R_3$ is C6-C10 linear alkyl; and

M is independently of each other hydrogen, Na, or K.

The etchant composition for a semiconductor substrate according to an exemplary embodiment of the present disclosure may include 0.001 to 1 wt % of the compound represented by Chemical Formula 1, 4 to 20 wt % of the hydrofluoric acid, 4 to 20 wt % of the nitric acid, 20 to 60 wt % of the acetic acid, 1 to 20 wt % of the phosphoric acid, and a balance of water, with respect to the total weight of the etchant composition for a semiconductor substrate.

Specifically, the etchant composition for a semiconductor substrate may include 0.05 to 1 wt % of the compound represented by Chemical Formula 1, 5 to 20 wt % of the hydrofluoric acid, 5 to 20 wt % of the nitric acid, 20 to 50 wt % of the acetic acid, 1 to 15 wt % of the phosphoric acid, and a balance of water.

More specifically, the etchant composition for a semiconductor substrate may include 0.01 to 1 wt % of the compound represented by Chemical Formula 1, 10 to 15 wt % of the hydrofluoric acid, 10 to 20 wt % of the nitric acid, 20 to 40 wt % of the acetic acid, 5 to 15 wt % of the phosphoric acid, and a balance of water.

In addition, the etchant composition for a semiconductor substrate according to an exemplary embodiment of the present disclosure oxidizes an object to be etched by the nitric acid to help to facilitate etching. Thus, the etchant composition for a semiconductor substrate may include 0.3 to 1 part by weight of the hydrofluoric acid, 0.3 to 1 part by weight of the phosphoric acid, and 1 to 4 parts by weight of the acetic acid; 0.5 to 1 part by weight of the hydrofluoric acid, 0.5 to 1 part by weight of the phosphoric acid, and 1.5 to 3 parts by weight of the acetic acid; or 0.6 to 1 part by weight of the hydrofluoric acid, 0.6 to 1 part by weight of the phosphoric acid, and 1.5 to 2.5 parts by weight of the acetic acid, based on 1 part by weight of the nitric acid. When the weight ratio described above is satisfied, uniform and stable etching is allowed, of course, and an appropriate viscosity may be applied, so that further improved etching properties may be shown.

In the etchant composition according to an exemplary embodiment of the present disclosure, when an amount of phosphoric acid used is out of the range, an etching rate is significantly lowered by the viscosity, and when an amount of acetic acid used is out of the range, an etching rate is significantly lowered since an interaction on the surface of the object to be etched is not smooth, which is thus not preferred. In addition, when an amount of nitric acid used is out of the range, the etching rate for the first doped layer is decreased, and the etching rate for the second doped layer is rather increased, so that an etch selection ratio is significantly lowered, which is thus not preferred. In addition, in the etchant composition according to an exemplary embodiment of the present disclosure, when an amount of the compound of Chemical Formula 1 used is out of the range, an excessive amount of bubble formation is caused during an etching process, resulting in a residual problem and non-uniform etching for a high-concentration doped layer, which is thus not preferred.

The etchant composition according to an exemplary embodiment of the present disclosure may include at least two or more different compounds of Chemical Formula 1 from each other, and thus, may implement a more significant etch selection ratio.

In addition, the etchant composition according to an exemplary embodiment of the present disclosure may further include diphenyl oxide disulfonate having no alkyl group. Here, the diphenyl oxide disulfonate may be represented by the following Chemical Formula A:

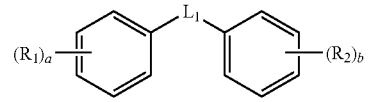

Chemical Formula A wherein $R_1$, $R_2$, $L_1$, a, and b are as defined in Chemical Formula 1.

In the etchant composition according to an exemplary embodiment of the present disclosure, both $R_1$ and $R_2$ in Chemical Formula A may be sulfonate; and a and b may be independently of each other an integer of 1 or 2.

The diphenyl oxide disulfonate represented by Chemical Formula A may be used at 0.01 to 3 parts by weight, specifically 0.1 to 2 parts by weight, and more specifically 0.5 to 1.5 parts by weight, based on 1 part by weight of the compound of Chemical Formula 1, but is not limited thereto.

Water included in the etchant composition for a semiconductor substrate according to an exemplary embodiment of the present disclosure is not particularly limited, but may be specifically deionized water, more specifically deionized water for a semiconductor process, and may have a resistivity value of 18 MΩ·cm or more.

As described above, the etchant composition according to an exemplary embodiment of the present disclosure may be for etching an extrinsic semiconductor substrate having non-metals doped at different concentrations. Specifically, the extrinsic semiconductor substrate may include a first doped layer having a non-metal doped at a first concentration and a second doped layer having a non-metal doped at a second concentration lower than the first concentration.

As an example, the first doped layer may be a silicon substrate having a non-metal doped at 1.0 to $9.9 \times 10^{18}/cm^3$.

As an example, the second doped layer may have a difference of $7.0 \times 10^{18}/cm^3$ or more as compared with the first doped layer. In addition, the second doped layer may have a difference of less than $7.0 \times 10^{18}/cm^3$ as compared with the first doped layer. In particular, according to the present disclosure, in spite of the conditions of $1.0 \times 10^{18}/cm^3$ or more and less than $7.0 \times 10^{18}/cm^3$, the first doped layer may be selectively etched.

The etchant composition according to an exemplary embodiment of the present disclosure may satisfy the following Relation 1. Here, Relation 1 may refer to an etch selection ratio of the second doped layer which is a low-concentration doped layer to the first doped layer which is a high-concentration doped layer.

$$E_{Sub}/E_{Epi} \geq 30$$  Relation 1 wherein $E_{Sub}$ is an etching rate for the first doped layer; and $E_{Epi}$ is an etching rate for the second doped layer.

As an example, the etchant composition ($E_{Sub}/E_{Epi}$) of the etchant composition may satisfy a range of more than 30 and 150 or less or a range of 31 to 95.

As an example, the etchant composition may have the etching rate for the first doped layer of 5 to 30 μm/min and the etching rate for the second doped layer of 0 to 0.5 μm/min.

As an example, the etchant composition may have the etching rate for the first doped layer of 8 to 25 μm/min and the etching rate for the second doped layer of 0.1 to 0.45 μm/min.

In addition, the etchant composition according to an exemplary embodiment of the present disclosure may satisfy Relation 1 and also have a contact angle to the first doped layer of 44° or less. When the angle is more than this, an interaction between a chemical liquid and the surface of the object to be etched is not smooth, so that the first doped layer is not oxidized and not etched, which is thus not preferred.

In addition, the etchant composition according to an exemplary embodiment of the present disclosure may have a contact angle ($\gamma_{sub}$) to the first doped layer of 40° or less or 20 to 40° and may satisfy a contact angle difference from the second doped layer ($\gamma_{epi}-\gamma_{sub}$) of 3 to 15° or 5 to 15°. When these are satisfied, the composition may be evaluated to have high selectivity.

In addition, the etchant composition according to an exemplary embodiment of the present disclosure may not include an additive selected from a para-toluene sulfonic acid, a methane sulfonic acid, a dodecylbenzene sulfonic acid, salts thereof, and the like.

Hereinafter, a use of the etchant composition according to the present disclosure will be described.

A first embodiment of the present disclosure may be an etching method of a semiconductor substrate using the etchant composition described above.

A second embodiment of the present disclosure may be a manufacturing method of a semiconductor device including an etching process performed by the etching method of a semiconductor substrate described above.

The etching method of a semiconductor substrate according to an exemplary embodiment of the present disclosure may be for etching an extrinsic semiconductor substrate, and specifically, for etching an extrinsic semiconductor substrate including doped layers having different doping concentration from each other. Here, an object to be etched of the etchant composition according to the present disclosure may be a high-concentration doped layer having a higher doping concentration in the extrinsic semiconductor substrate. That is, the etchant composition according to the present disclosure may be for selective etching for a high-concentration doped layer.

The doped layer may be formed by doping one or more elements selected from boron, arsenic, phosphorus, and the like. Here, when an element having 4 or fewer outermost electrons such as boron is doped, the extrinsic semiconductor substrate may be a p-type element-doped semiconductor substrate; and when an element having more than 4 outermost electrons such as arsenic and phosphorus is doped, the extrinsic semiconductor substrate may be an n-type element-doped semiconductor substrate.

According to the etching method of a semiconductor substrate according to an exemplary embodiment of the present disclosure, even when a concentration difference between the first doped layer and the second doped layer is less than $7.0 \times 10^{18}/cm^3$, there is no disadvantage to etch selectivity. The difference in doping concentration as such is according to the recent requirement for a semiconductor device for miniaturization and higher resolution, and the present disclosure has meaning in that though selective etching for an extrinsic semiconductor substrate having a concentration difference as such was impossible with a conventional etchant composition, etching is now possible with high etch selectivity according to the present disclosure.

According to the etching method of a semiconductor substrate according to an exemplary embodiment of the present disclosure, it may be useful for a manufacturing method of a semiconductor device which may implement high quantum efficiency, thereby providing a highly reliable semiconductor device.

Specifically, an etching method of a semiconductor substrate using the etchant composition according to an exemplary embodiment of the present disclosure may include bringing an extrinsic semiconductor substrate including a first doped layer having a non-metal doped at a first concentration and a second doped layer having a non-metal doped at a second concentration lower than the first concentration into contact with the etchant composition for a semiconductor substrate described above. Here, the contact may be performed according to a common wet etching method, and may be performed in ranges of common temperature conditions and treatment time accordingly, of course.

As an example, the contact may be performed by a method of dipping the extrinsic semiconductor substrate in the etchant composition. Otherwise, the contact may be performed by a method of spraying the etchant composition on the extrinsic semiconductor substrate.

As an example, the dipping method may be performed at a process temperature of 100° C. or lower, specifically 20 to 100° C., and more specifically 20 to 40° C. Here, a treatment time may be within 5 to 30 minutes, and may be appropriately adjusted according to the purpose, of course.

By the etching method of a semiconductor substrate using the etchant composition according to an exemplary embodiment of the present disclosure, the first doped layer may be rapidly etched with high selectivity to provide a uniform semiconductor substrate. As mentioned above, even in the case in which a difference in doping concentration between the doped layers included in the semiconductor substrate is small, excellent effect may be shown. In addition, since bubble formation is effectively suppressed, the method is commercially useful.

In addition, the present disclosure provides a manufacturing method of a semiconductor device which is performed by the etching method of a semiconductor substrate. According to the manufacturing method of a semiconductor device, the first doped layer may be selectively etched and damage of the second doped layer having a lower doping concentration may be effectively suppressed. Thus, stability, efficiency, and reliability of the manufacturing process of the semiconductor device may be greatly improved. In this case, the type of semiconductor devices is not particularly limited in the present disclosure.

The first doped layer and the second doped layer may be formed on an amorphous silicon wafer. In addition, on at least one surface selected from the first doped layer and the second doped layer, an additional functional layer may be further included or may not be included according to the purpose.

The functional layer may be selected from an insulation layer and a conductive layer. A non-limiting example of the insulation layer may be selected from silicon nitrides such as SiN layer, SiON layer, and doped SiN layer; and silicon oxides such as spin on dielectric (SOD) layer, high density plasma (HDP) layer, thermal oxide, borophosphate silicate glass (BPSG) layer, phospho silicate glass (PSG) layer, borosilicate glass (BSG) layer, polysilazane (PSZ) layer, fluorinated silicate glass (FSG) layer, low pressure tetraethyl ortho silicate (LP-TEOS) layer, plasma enhanced tetraethyl ortho silicate (PETEOS) layer, high temperature oxide (HTO) layer, medium temperature oxide (MTO) layer, undoped silicate glass (USG) layer, spin on glass (SOG) layer, advanced planarization layer (APL) layer, atomic layer deposition (ALD) layer, plasma enhanced oxide (Pe-oxide) layer, and O3-tetraethyl orthosilicate (O3-TEOS). In addition, the conductive layer may include one or two or more metals selected from Ag, Mg, Al, Pt, Pd, Au, Ni, Nd, Jr, Cr, Li, Ca, Mo, Ti, Sn, Zn, In, W, and the like.

As described above, according to the present disclosure, in etching the extrinsic semiconductor substrate including the first doped layer and the second doped layer, the first doped layer may be etched with high selectivity, and the etching rate for the second doped layer is significantly decreased, thereby providing a highly reliable extrinsic semiconductor substrate. In addition, even when the extrinsic semiconductor substrate includes the functional layer described above, stable etching is possible without a disadvantage in etching properties.

Therefore, according to the present disclosure, in treating extrinsic semiconductor substrates of various embodiments, only a high-concentration doped layer to be desired may be removed at an excellent selection ratio, and a uniform and highly reliable semiconductor substrate may be provided. In addition, even with an increased treatment time, an etching rate and an etch selection ratio may be maintained constant. Thus, according to the present disclosure, an effect beyond the effect of a conventional etchant composition is implemented, thereby providing a highly reliable semiconductor device which is required for a semiconductor device and the like for miniaturization and higher resolution. In particular, it is expected that a conventional etchant composition for etching an extrinsic semiconductor substrate may be replaced by implementing significant etching properties as compared with the conventional etchant composition.

Hereinafter, the present disclosure will be described in more detail through the following examples. However, the following examples are for describing the present disclosure in more detail, and the scope of the present disclosure is not limited to the following examples. The following examples may be appropriately modified and changed by a person skilled in the art within the scope of the present disclosure, of course.

In addition, unless otherwise stated in the present disclosure, the unit of temperature is ° C., and the unit of the amount of a composition used is wt %.

Evaluation Method

Measurement of Etching Rate

Specifically, an extrinsic semiconductor substrate (boron (B) concentration of first doped layer:second doped layer=$7.0\times10^{18}/cm^3$:$3.0\times10^{14}/cm^3$) was cut into 10×20 mm to prepare an evaluation substrate, and the thickness and the weight of each substrate were measured. Each of the etchant compositions of the examples and the comparative examples was added to a bath maintained at a temperature of 25° C. by a thermostat, and a wafer was dipped therein for 15 minutes to perform an etching process. After etching was completed, washing is performed using ultra-pure water, and a residual etchant composition and moisture were completely dried using a drying device. Thereafter, the weight of the dried substrate was measured, a weight change before and after evaluation was calculated, and the etching rate was measured by the following Equation 1:

(Initial substrate thickness*weight reduction rate)/treatment time=etching rate     Equation 1

2. Measurement of Bubble Formation 200 ml of each of the etchant compositions of the example and the comparative example was prepared in a 1 L measuring cylinder. After bubble was formed in each etchant composition for 1 minute using $N_2$ gas, a defoaming speed was measured. At this time, bubble formation was indicated as ○ when the speed measured by the above method was 10 seconds or less (≤10 s), and x when the speed was more than 10 seconds (>10 s).

3. Measurement of Contact Angle

In the extrinsic semiconductor substrate, the surface was washed with dilute HF (DHF) for removing a natural oxide film of the first doped layer and the second doped layer. Immediately, 5 μl of each etchant composition of the example and the comparative example was dropped to the layer for each evaluation, and then a contact angle was measured by a CCD camera.

Examples 1 to 11 and Comparative Examples 1 to 6

Each component was mixed at the component contents described in the following Table 1 to prepare the etchant compositions of the examples and the comparative examples according to the present disclosure.

TABLE 1

| | Etchant (wt %) | | | | Additive (wt %) | |
| --- | --- | --- | --- | --- | --- | --- |
| Classification | Hydrofluoric acid | Nitric acid | Phosphoric acid | Acetic acid | Material | Content |
| Example 1 | 13 | 15 | 10 | 30 | C1 | 0.1 |
| Example 2 | 13 | 15 | 10 | 30 | C1 | 0.3 |
| Example 3 | 13 | 15 | 10 | 30 | C1 | 0.5 |
| Example 4 | 13 | 15 | 10 | 30 | C1 | 1 |
| Example 5 | 13 | 15 | 10 | 30 | C2 | 0.1 |
| Example 6 | 13 | 15 | 10 | 30 | C2 | 0.32 |
| Example 7 | 13 | 15 | 10 | 30 | C3 | 0.1 |
| Example 8 | 13 | 15 | 10 | 30 | C1 + C2 | 0.1 + 0.1 |
| Example 9 | 13 | 15 | 10 | 30 | C1 | 1.5 |
| Example 10 | 13 | 15 | 10 | 30 | C1 + B1 | 0.1 + 0.1 |
| Example 11 | 13 | 15 | 10 | 10 | C1 | 0.1 |
| Comparative Example 1 | 13 | 15 | 10 | 30 | — | — |
| Comparative Example 2 | 13 | 15 | 10 | 30 | C4 | 0.1 |
| Comparative Example 3 | 4.5 | 20.9 | 5.5 | 50.8 | — | — |
| Comparative Example 4 | 13 | 15 | 10 | 30 | A1 | 0.15 |

TABLE 1-continued

| | Etchant (wt %) | | | | Additive (wt %) | |
|---|---|---|---|---|---|---|
| Classification | Hydrofluoric acid | Nitric acid | Phosphoric acid | Acetic acid | Material | Content |
| Comparative Example 5 | 13 | 15 | 10 | 30 | A2 | 0.28 |
| Comparative Example 6 | 13 | 15 | — | 30 | C1 | 0.1 |

C1: Sodium diphenyl oxide disulfonate (C6)
C2: Sodium diphenyl oxide disulfonate (C8)
C3: Sodium diphenyl oxide disulfonate (C10)
C4: Sodium diphenyl oxide disulfonate (C16)
B1: Diphenyl oxide disulfonic acid
A1: p-Toluenesulfonic acid
A2: Dodecylbenzenesulfonic acid
Example 8: C1 + C2 (1:1, wt:wt)
Example 10: C1 + B1 (1:1, wt:wt)

TABLE 2

| | Contact angle (°) | | Etching rate (μm/min) | | Selection ratio | Bubble formation |
|---|---|---|---|---|---|---|
| Classification | $\gamma_{sub}$ | $\gamma_{epi} - \gamma_{sub}$ | $E_{Sub}$ | $E_{Epi}$ | $E_{Sub}/E_{Epi}$ | |
| Example 1 | 38.9 | 8.3 | 12.36 | 0.32 | 38.6 | x |
| Example 2 | 31.4 | 9.1 | 10.83 | 0.14 | 77.4 | x |
| Example 3 | 30.4 | 8.7 | 9.97 | 0.11 | 90.6 | x |
| Example 4 | 29.1 | 9.4 | 9.42 | 0.10 | 94.2 | x |
| Example 5 | 39.4 | 7.5 | 13.1 | 0.40 | 35.7 | x |
| Example 6 | 31.2 | 8.5 | 11 | 0.20 | 71.7 | x |
| Example 7 | 39.8 | 6.7 | 13.74 | 0.42 | 32.7 | x |
| Example 8 | 36.6 | 9 | 12.1 | 0.20 | 50.4 | x |
| Example 9 | 19.3 | 5.6 | 15.47 | 0.43 | 36.0 | x |
| Example 10 | 36.2 | 9 | 12.1 | 0.22 | 55.1 | x |
| Example 11 | 41.4 | 4.4 | 1.87 | 0.10 | 18.7 | x |
| Comparative Example 1 | 43.7 | 5.9 | 14.39 | 0.84 | 17.1 | x |
| Comparative Example 2 | 40.3 | 6.3 | 13.81 | 0.46 | 30.0 | o |
| Comparative Example 3 | 30.4 | 5.2 | 2.99 | 0.23 | 13.0 | x |
| Comparative Example 4 | 29.4 | 4.3 | 15.42 | 0.88 | 17.5 | x |
| Comparative Example 5 | 27.4 | 4.1 | 16.13 | 0.90 | 17.9 | x |
| Comparative Example 6 | 35.2 | 4.2 | 2.15 | 0.10 | 21.5 | x |

As shown in Table 2, it is confirmed that when the etchant composition according to the present disclosure was used, the first doped layer having a higher doping concentration included in the extrinsic semiconductor substrate including two doped layers having different doping concentrations was etched at a high selection ratio. In addition, the etchant composition according to the present disclosure suppressed bubble formation at the time of etching, thereby allowing more efficient etching of the extrinsic semiconductor substrate. Moreover, it is confirmed that when the etchant composition according to the present disclosure used two or more additives having different structures, a better effect in the etch selection ratio was shown. In addition, when both the compound represented by Chemical Formula 1 and diphenyl oxide disulfonate were included also, synergy in the etch selection ratio was shown.

In addition, the etchant composition according to the present disclosure had a low contact angle to the extrinsic semiconductor substrate including two doped layers having different doping concentrations from each other, thereby allowing implement of a higher etching rate and rapid etching of a doped layer having a high doping concentration at a high selection ratio.

However, in the comparative examples, the first doped layer having a high doping concentration included in the extrinsic semiconductor substrate having two layers having different doping concentrations from each other was not selectively etched or an excessive amount of bubbles were formed, so that stable etching was impossible. In addition, it is confirmed that when an additive including long chain alkyl having more than 10 carbon atoms was used, bubbles formed during the etching process did not subside to cause reduction of etching efficiency.

It will be apparent to those skilled in the art to which the present disclosure pertains that the present disclosure is not limited to the above-mentioned exemplary embodiments and the accompanying drawings, and may be variously substituted, modified, and altered without departing from the scope and spirit of the present disclosure.

The invention claimed is:

1. An etchant composition for a semiconductor substrate comprising: 0.001 to 1 wt % of a compound represented by the following Chemical Formula 1, 4 to 20 wt % of a hydrofluoric acid, 4 to 20 wt % of a nitric acid, 20 to 60 wt % of an acetic acid, 1 to 20 wt % of a phosphoric acid, and a balance of water with respect to a total weight of the etchant composition:

Chemical Formula 1

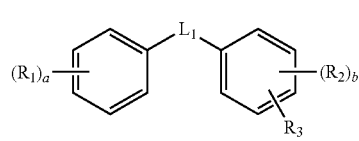

wherein
R$_1$ and R$_2$ are independently of each other a carboxylate, a sulfonate, or a sulfate;
R$_3$ is C1-C10 alkyl;
L$_1$ is —O—, —S—, or —NH—;
a is an integer of 1 to 3;
b is an integer of 0 to 3; and
when a or b is an integer of 2 or more, each substituent may be identical to or different from each other;
wherein the semiconductor substrate is an extrinsic semi-conductor substrate comprising a first doped layer having a non-metal doped at a first concentration and a second doped layer having a non-metal doped at a second concentration lower than the first concentration; and wherein the etchant composition for a semiconductor substrate satisfies the following Relation 1:

$$E_{Sub}/E_{Epi} \geq 30 \quad \text{[Relation 1]}$$

wherein $E_{Sub}$ is an etching rate for the first doped layer; and $E_{Epi}$ is an etching rate for the second doped layer.

2. The etchant composition for a semiconductor substrate of claim 1, wherein in Chemical Formula 1, a and b are independently of each other an integer of 1 or 2.

3. The etchant composition for a semiconductor substrate of claim 2, wherein in Chemical Formula 1, both $R_1$ and $R_2$ are sulfonate; and $R_3$ is C6-C10 alkyl.

4. The etchant composition for a semiconductor substrate of claim 1, wherein two or more of the compounds represented by Chemical Formula 1 which are different from each other are included.

5. The etchant composition for a semiconductor substrate of claim 1, wherein the composition further comprises diphenyl oxide disulfonate.

6. The etchant composition for a semiconductor substrate of claim 1, wherein the etching rate for the first doped layer is 5 to 30 μm/min and the etching rate for the second doped layer is 0 to 0.5 μm/min.

7. The etchant composition for a semiconductor substrate of claim 1, wherein a contact angle to the first doped layer is 44° or less.

8. The etchant composition for a semiconductor substrate of claim 1, wherein the etchant composition for a semiconductor substrate has a difference between the contact angles to the first doped layer and the second doped layer of 3° or more.

9. The etchant composition for a semiconductor substrate of claim 1, wherein the Chemical Formula 1 is represented by the following Chemical Formula 2:

[Chemical Formula 2]

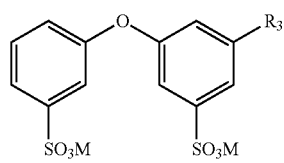

wherein $R_3$ is C1-C10 alkyl; and

M is independently of each other hydrogen, Na, or K.

10. An etching method comprising:

bringing an extrinsic semiconductor substrate including a first doped layer having a non-metal doped at a first concentration and a second doped layer having a non-metal doped at a second concentration lower than the first concentration into contact with the etchant composition for a semiconductor substrate according to claim 1.

11. A manufacturing method of a semiconductor device, the method comprising the etching method according to claim 10.

* * * * *